(12) United States Patent  (10) Patent No.: US 8,868,990 B2
Nakano et al.  (45) Date of Patent:  Oct. 21, 2014

(54) SEMICONDUCTOR MEMORY DEVICE AND INFORMATION PROCESSING APPARATUS INCLUDING THE SAME

(75) Inventors: Rikizo Nakano, Kawasaki (JP); Osamu Ishibashi, Kawasaki (JP); Sadao Miyazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 389 days.

(21) Appl. No.: 13/430,766

(22) Filed: Mar. 27, 2012

(65) Prior Publication Data

US 2012/0254663 A1  Oct. 4, 2012

(30) Foreign Application Priority Data

Mar. 29, 2011  (JP) ................................. 2011-073672

(51) Int. Cl.
| | | |
|---|---|---|
| *G11C 29/00* | (2006.01) | |
| *G06F 13/00* | (2006.01) | |
| *H03K 19/003* | (2006.01) | |
| *H03K 19/094* | (2006.01) | |
| *G11C 29/50* | (2006.01) | |
| *G11C 29/02* | (2006.01) | |
| *G11C 29/04* | (2006.01) | |
| *G01R 31/3187* | (2006.01) | |
| *G11C 29/12* | (2006.01) | |
| *G11C 29/08* | (2006.01) | |
| *G11C 29/14* | (2006.01) | |
| *H04L 25/02* | (2006.01) | |

(52) U.S. Cl.
CPC .......... *G11C 29/50012* (2013.01); *G11C 29/02* (2013.01); *G11C 29/04* (2013.01); *G01R 31/3187* (2013.01); *G11C 29/12* (2013.01); *G11C 29/00* (2013.01); *G11C 29/08* (2013.01); *G11C 29/14* (2013.01); *H04L 25/0278* (2013.01); *G11C 29/1201* (2013.01)
USPC ........... 714/718; 714/763; 711/104; 711/105; 365/200; 326/30; 326/86; 326/87

(58) Field of Classification Search
CPC ..................... G11C 29/50012; G11C 29/1201; G11C 29/00; G11C 29/02; G11C 29/04; G11C 29/08; G11C 29/12; G11C 29/14; G01R 31/3187; H04L 25/0278
USPC ........... 714/718, 763; 711/104, 105; 365/200; 326/30, 86, 87
See application file for complete search history.

(56) References Cited

U.S. PATENT DOCUMENTS 6,327,224 B1 * 12/2001 Braceras et al. .............. 368/113
7,176,711 B2 *  2/2007 Park et al. ....................... 326/30
(Continued)

FOREIGN PATENT DOCUMENTS

| JP | 11-264856 | 9/1999 |
|---|---|---|
| JP | 2009-252307 | 10/2009 |

*Primary Examiner* — John J Tabone, Jr.
(74) *Attorney, Agent, or Firm* — Fujitsu Patent Center

(57) ABSTRACT

A semiconductor memory device is disclosed that includes an ODT circuit configured to be connected to a bus which transmits a data signal or a data strobe signal between a memory block and an input-output terminal; a first switch configured to be inserted into the bus between the memory block and the ODT circuit; a mode controller configured to switch off the first switch during a test of the memory block; and an oscillator configured to be connected to the ODT circuit, wherein a test signal is supplied to the ODT circuit from the oscillator during the test of the memory block.

12 Claims, 6 Drawing Sheets

(56) References Cited

U.S. PATENT DOCUMENTS

| | | | |
|---|---|---|---|
| 7,230,448 B2 * | 6/2007 | Choe | 326/30 |
| 7,400,165 B2 * | 7/2008 | Park | 326/30 |
| 7,696,776 B2 * | 4/2010 | Park | 326/30 |
| 8,671,243 B2 * | 3/2014 | Chen et al. | 711/104 |
| 2009/0091349 A1 * | 4/2009 | Bhakta et al. | 326/30 |
| 2009/0254784 A1 * | 10/2009 | Sonoda et al. | 714/718 |
| 2011/0175639 A1 * | 7/2011 | Yoko et al. | 324/762.06 |

* cited by examiner

FIG.3

| | SWITCH 104 | SWITCH 170A | SWITCH 170B | ODT CIRCUIT 190A | ODT CIRCUIT 190B |
|---|---|---|---|---|---|
| NORMAL MODE | OFF | ON | ON | SWITCH ON $192_1$ OR $192_2$ | SWITCH ON $192_1$ OR $192_2$ |
| TEST MODE (NOISE) | ON | OFF | OFF | SWITCH ON $192_1$, $192_2$ OR $192_3$ | SWITCH ON $192_1$ OR $192_2$ |
| TEST MODE (HEAT) | ON | OFF | OFF | SWITCH ON $192_3$ | SWITCH ON $192_1$ OR $192_2$ |

SEMICONDUCTOR MEMORY DEVICE AND INFORMATION PROCESSING APPARATUS INCLUDING THE SAME

CROSS-REFERENCE TO RELATED APPLICATIONS

This patent application is based upon and claims the benefit of priority of the prior Japanese Patent Application No. 2011-073672 filed on Mar. 29, 2011, the entire contents of which are incorporated herein by reference.

FIELD

The embodiments discussed herein are related to a semiconductor memory device and an information processing apparatus including the same.

BACKGROUND

There has been a semiconductor memory device which includes a Random Access Memory (RAM), an On Die Termination (ODT) circuit and a Join Test Action Group (JTAG) circuit. The RAM is connected to a data input/output (I/O) port, and the ODT circuit is connected between the data I/O port and a terminal port. The JTAG circuit controls the ODT circuit so that the ODT circuit connects the data I/O port and the terminal port in accordance with a command.

Moreover, there has been a terminal resistor circuit which includes a test resistor circuit and a control circuit. The test resistor circuit includes a test resistor which is connected in parallel with a terminal resistor of the terminal resistor circuit and has a larger resistance than that of the terminal resistor. The controller applies a higher voltage (H) and a lower voltage (L) to the test resistor circuit. The test resistor circuit outputs different voltages in a case where the terminal resistor circuit operates normally and in a case where the terminal resistor circuit is broken.

However, for example, it may be necessary to shift or fluctuate power-supply voltage of the semiconductor memory device in order to conduct a noise margin test of the conventional semiconductor memory device per se.

Since it may be difficult to apply a clock signal other than the clock signal of an operating frequency to the semiconductor memory device in a situation where the semiconductor memory device is mounted onto a circuit board with a Central Processing Unit (CPU) or the like, it may be difficult to conduct the noise margin test of the semiconductor memory device in the situation as described above.

Further, it may be necessary to put the semiconductor memory device into a high-temperature storage in order to conduct a heat test thereof.

The conventional terminal resistor circuit outputs the higher voltage or the lower voltage in accordance with a result of a test of a Large Scale Integrated circuit (LSI). Thus, it may be necessary to shift the power-source voltage or to heat the LSI in order to conduct the noise margin test or the heat test of the LSI, respectively.

As described above, the conventional semiconductor memory device and the conventional terminal resistor circuit have problems in that it may be difficult to conduct the tests.

PRIOR ART REFERENCES

Patent References

[Patent Document 1] Japanese Patent Laid-Open Publication No. 2009-252307

[Patent Document 2] Japanese Patent Laid-Open Publication No. 11-264856

SUMMARY

According to an aspect of an embodiment, there is provided a semiconductor memory device including: an ODT circuit configured to be connected to a bus which transmits a data signal or a data strobe signal between a memory block and an input-output terminal; a first switch configured to be inserted into the bus between the memory block and the ODT circuit; a mode controller configured to switch off the first switch during a test of the memory block; and an oscillator configured to be connected to the ODT circuit, wherein a test signal is supplied to the ODT circuit from the oscillator during the test of the memory block.

In another aspect, there is provided a information processing apparatus including: the semiconductor memory device as described above; and a processing unit configured to be connected to the semiconductor memory device, the processing unit writes data to the semiconductor memory device and reads data from the semiconductor memory device.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 3 is a diagram illustrating on and off states of switches included in the memory in a normal mode and a test mode;

DESCRIPTION OF EMBODIMENTS

A description is given, with reference to the accompanying drawings, of embodiments of a semiconductor memory device and an information processing apparatus including the same.

First Embodiment

Figure 1:
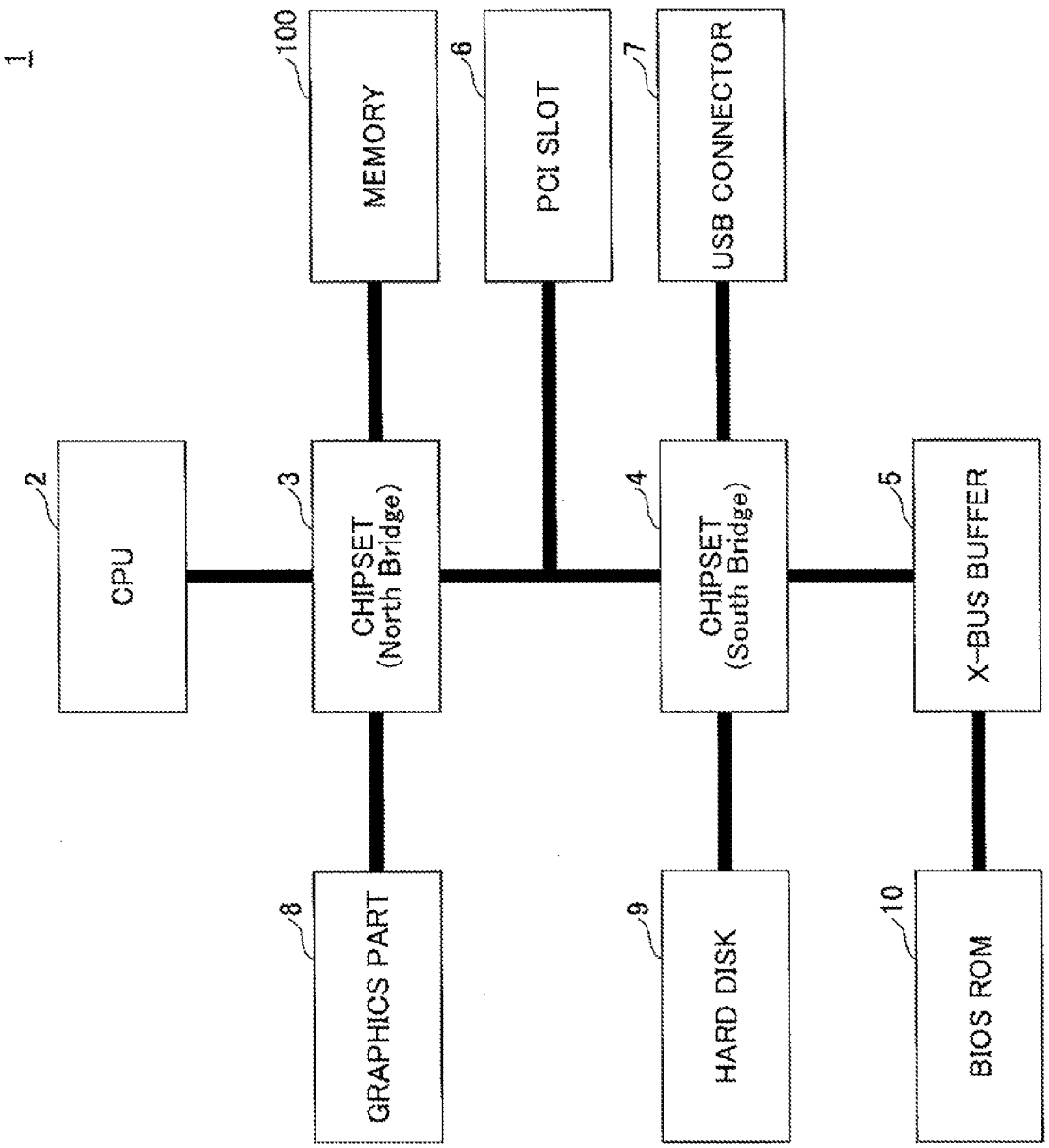
FIG. 1 is a diagram illustrating an internal configuration of a PC including a semiconductor memory device of a first embodiment.

FIG. 1 is a diagram illustrating an internal configuration of a Personal Computer (PC) 1 including a semiconductor memory device of the first embodiment.

The PC 1 is one example of the information processing apparatus including the semiconductor memory device of the first embodiment. The PC 1 includes a Central Processing Unit (CPU) 2, chipsets 3 and 4, an X-Bus buffer 5, a memory 100 and a Peripheral Components Interconnect (PCI) slot 6. The PC 1 further includes a Universal Serial Bus (USB) connector 7, a graphics part 8, a hard disk 9 and Basic Input Output System (BIOS) Read Only Memory (ROM) 10.

The CPU 2 is connected to the chipset 3, and connected to the chipset 4, the memory 100 and the graphics part 8 via the chipset 3. The memory 100 is a main memory of the PC 1. The CPU 2 executes operational processes by reading data from or writing data to the memory 100 via the chipset 3, for example.

The chipset 3 constitutes a North Bridge of the PC 1 and includes a memory controller, a graphics interface or the like. The chipset 3 is connected to the CPU 2, the memory 100, the PCI slot 6 and the graphics part 8 via buses.

The chipset 4 constitutes a South Bridge of the PC 1 and includes I/O ports that are connected to the X-Bus buffer 5, the PCI slot 6, the USB connector 7 and the hard disk 9.

The chipset 4 is connected to the X-Bus buffer 5, the PCI slot 6, the USB connector 7 and the hard disk via buses. The PCI slot 6 is connected to the bus which is located between the chipsets 3 and 4.

The X-Bus buffer 5 is connected between the chipset 4 and the BIOS ROM 10. The X-Bus buffer 5 constitutes a buffer which is used for the X-Bus between the BIOS ROM 10 and the chipset 4.

The memory 100 is the main memory of the PC 1. A Dynamic Random Access Memory (DRAM) may be used as the memory 100. The memory 100 is connected to the CPU 2 via the chipset 3. Data stored in the memory 100 is read by the CPU 2. The CPU 2 writes data into the memory 100.

The PCI slot 6 is a type of a slot which connects an external memory or a wireless card which includes standardized connectors, terminals or the like that are standardized under PCI standards.

The USB connector 7 is a type of a connector which connects an external device such as memory or the like which includes standardized connectors, terminals or the like that are standardized under the USB standards.

The graphics part 8 is a type of a controller to which a monitor such as a Liquid Crystal Display (LCD) or the like is connected. The graphic part 8 controls displaying on the monitor.

The hard disk 9 is a type of an external memory device which stores data that is used during the operational processing of the CPU 2, data that is generated during the operational processing and data that is input into the PC 1 via the PCI slot 6, the USB connector 7 or the like.

The BIOS ROM 10 is a type of a ROM which stores a BIOS program and is connected to the chipset 4 via the X-Bus buffer 5.

Although the PC 1 is illustrated as one example of the information processing apparatus of the first embodiment, the information processing apparatus may be a server.

Next, the memory 100 of the first embodiment is described with reference to FIG. 2.

Figure 2:
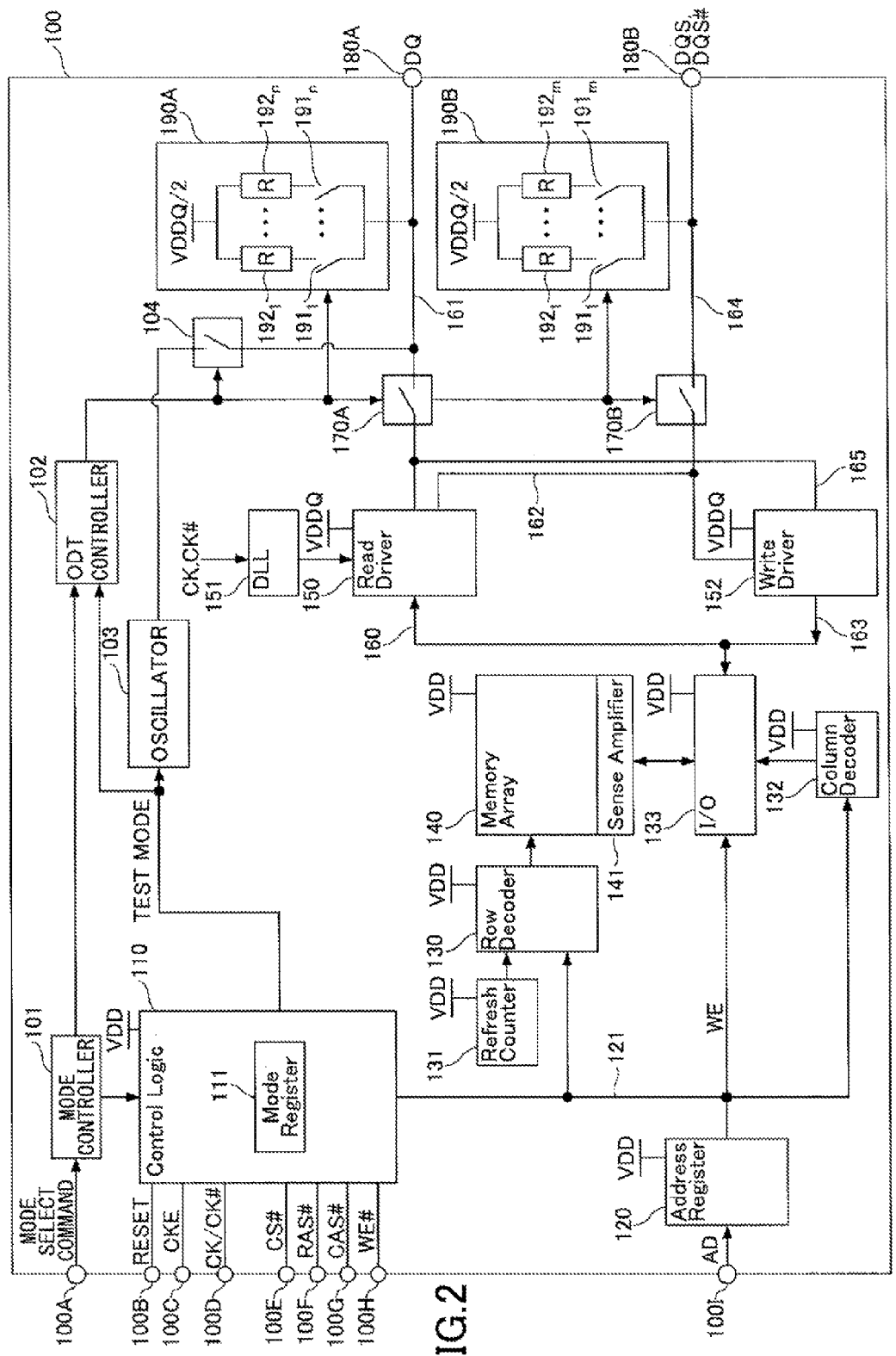
FIG. 2 is a block diagram illustrating a memory of the first embodiment.

FIG. 2 is a block diagram illustrating the memory 100 of the first embodiment.

The memory 100 is one example of the semiconductor memory device according to the first embodiment. Herein, the embodiment in that the memory 100 is constituted of DRAM is described, for example.

The memory 100 includes terminals 100A to 100I, a mode controller 101, an ODT controller 102, an oscillator 103, a switch 104, a controller (Control Logic) 110, a mode register 111 and an address register 120. The terminals 100A to 100I are connected to the chipset 3 (see FIG. 1).

The memory 100 further includes a bus 121, a row decoder 130, a refresh counter 131, a column decoder 132, an I/O port 133 and a memory array 140.

The memory 100 further includes a read driver 150, a delay locked loop (DLL) 151 and a write driver 152.

The memory 100 further includes buses 160, 161, 162, 163, 164 and 165, switches 170A and 170B, a data I/O terminal 180A, a data strobe signal I/O terminal 180B and ODT circuits 190A and 190B.

Herein, the memory as illustrated in FIG. 2 may be realized by LSI and manufactured as a single memory chip by a semiconductor manufacturing technique, for example.

The mode controller 101 selects a mode of the memory 100 between a test mode of the memory 100 and an operation mode (normal mode) in that the memory 100 operates normally as the DRAM. The mode controller 101 selects the mode of the memory 100 between the test mode and the operation mode based on a mode select command which is input from the CPU 2 (see FIG. 1) via the terminal 100A. The mode controller 101 outputs a mode select signal which indicates the selected mode to the ODT controller 102.

The mode controller 101 may be realized by a combinational circuit which outputs the mode select signal based on the mode select command input from the CPU 2 via the chipset 3, for example.

Herein, the test of the memory 100 means the noise margin test or the heat test of the memory 100. Hereinafter, terms "during the test" mean a period of time in that the noise margin test or the heat test of the memory 100 is performed. Terms "test mode" mean the mode which is set by the mode controller 101 so that the test of the memory 100 can be conducted. The test mode includes a noise margin test mode in which the noise margin test is conducted, and a heat test mode in which the heat test is conducted.

In the test mode, a reading operation of the memory 100 in which the data is read from the memory 100 and a writing operation in which the data is written to the memory 100 are prohibited. Thus, the data stored in the memory array 140 is not changed by the reading operation or the writing operation in the test mode. However, the memory array 140 is constantly refreshed in the test mode.

When the memory 100 operates normally, the test of the memory 100 is not conducted and the memory 100 performs the reading operation and the writing operation. Hereinafter, terms "during normal operation" mean a period of time in which the memory 100 performs the reading operation or the writing operation. Terms "normal mode" mean the mode which is set by the mode controller 101 so that the memory 100 can perform the normal operation.

An Input terminal of the ODT controller 102 is connected to the mode controller 101, and an output terminal of the ODT controller 102 is connected to the switches 104, 170A and 170B, and the ODT circuits 190A and 190B.

The ODT controller 102 controls switching on and off of the switches 104, 170A and 170B, and the switches $191_1$~$191_n$ of the ODT circuit 190A, and the switches $191_1$~$191_m$ of the ODT circuit 190B in accordance with the mode select signal which is input from the mode controller 101.

The ODT controller 102 may be realized by a combinational circuit which performs switching on and off of the switches 104, 170A and 170B, and the switches $191_1$~$191_n$ of the ODT circuit 190A, and the switches $191_1$~$191_m$ of the ODT circuit 190B in accordance with the mode select signal which is input from the mode controller 101, for example.

Herein, suffix n indicates number of the switches $191_1$~$191_n$ of the ODT circuit 190A. The suffix n is greater than or equal to two. Herein, suffix m indicates number of the switches $191_1$~$191_m$ of the ODT circuit 190B. The suffix m is greater than or equal to two. The suffix n may be equal to the suffix m, or may be different from the suffix m.

The oscillator 103 is a type of an oscillator which can oscillate a clock signal at an arbitrary frequency. The oscillator 103 oscillates a clock signal of which the frequency is determined by the test mode signal when the test mode signal is input from the mode register 111 of the controller 110.

An output terminal of the oscillator 103 is connected to the ODT circuit 190A via the switch 104 and the bus 161. The clock signal output from the oscillator 103 is supplied to the ODT circuit 190A in a condition in which the switch 170A is switched off during the test.

The switch 104 is connected between the oscillator 103 and the bus 161 and is controlled to be switched on and off by the controller 102. The switch 104 is switched on when the test of the memory 100 is conducted, and is switched off when the memory 100 performs the normal operation of DRAM. The switch 104 may be realized by a transistor which is switched on and off by the ODT controller 102, for example.

The controller 110 includes the mode register 111 and constitutes a controller which controls operations of the memory 100 as DRAM. The controller 110 may be realized by a combinational circuit.

The mode select signal is input to the controller 110 from the mode controller 101. A reset signal (RESET), a clock enable signal (CKE) and differential clock signals (CK/CK#) are input to the controller 110 from the CPU 2 via the chipset 3.

The reset signal (RESET), the clock enable signal (CKE) and the differential clock signals (CK/CK#) are input to the controller 110 of the memory 100 from the chipset 3 via the terminals 110B, 110C and 110D, respectively.

A chip select signal (CS), a row address strobe signal (RAS#), a column address strobe signal (CAS#) and a write enable signal (WE#) are input to the controller 110 from the CPU 2 via the chipset 3.

The chip select signal (CS#), the row address strobe signal (RAS#), the column address strobe signal (CAS#) and the write enable signal (WE#) are input to the controller 110 of the memory 100 from the chipset 3 via the terminals 100D, 100E, 100F and 100H, respectively.

The mode register 111 outputs the test mode signal to the ODT controller 102 and the oscillator 103.

As for the signals including suffix #, the controller 110 operates based on L (low) levels of the signals.

The address register 120 is a type of a register which holds an address signal (AD) that is input from the CPU 2 via the chipset 3. The address signal (AD) includes a row address signal and a column address signal. The address signal (AD) is input to the controller 110 of the memory 100 from the chipset 3 via the terminal 1001.

The row address signal and the column address signal output from the address register 120 are input to the row decoder 130 and the column decoder 132 via the bus 121.

The bus 121 connects the controller 110, the address register 120, the row decoder 130, the column decoder 132 and the I/O port 133.

The row decoder 130 outputs row address data which is obtained by decoding the row address signal that is input from the address register 120 via the bus 121. Selection of the row in the memory array 140 is performed based on the row address data.

When a count-up signal is input to the row decoder 130 from the refresh counter 131, the row decoder 130 outputs the row address strobe signal to every row of the memory array 140 so that the memory array 140 is to be refreshed.

The refresh counter 131 counts a designated period of time which indicates an interval of a refresh operation of DRAM, and outputs the count-up signal at every interval of the designated period of time. The refresh operation of the memory array 140 is performed based on the count-up signal.

The column decoder 132 outputs column address data which is obtained by decoding the column address signal that is input from the address register 120 via the bus 121. Selection of the column in the memory array 140 is performed based on the column address data.

The I/O port 133 reads the data from the memory array 140 and writes the data to the memory array 140 based on the write enable signal (W/E) which is input from the controller 110 via the bus 121.

The memory array 140 includes a number of bit cells. The bit cell from which the data is read or to which the data is written is designated by the row address data and the column address data.

When the I/O port 133 writes data (DQ) to the memory array 140, the data (DQ) is input to the I/O port 133 via the data I/O terminal 180A, the buses 161 and 165 and the write driver 152, and the data strobe signal is input to the I/O port 133 via the data strobe signal I/O terminal 180B, the bus 164 and the write driver 152.

The I/O port 133 writes the data (DQ) to the memory array 140 when the data strobe signal (DQS), which is input to the I/O port 133 from the write driver 152 via the bus 163, rises up to H (High) level.

The I/O port 133 reads the data from the memory array 140 when the data strobe signal, which is output from the memory array 140, rises up to the H level.

The data (DQ) and the data strobe signal (DQS) that are read from the memory array 140 are input to the read driver 150 via the bus 160. The data (DQ) is output from the data I/O terminal 180A via the bus 161, and the data strobe signal (DQS) is output from the data strobe signal I/O terminal 180B via the buses 162 and 164.

Herein, amplification and wave shaping are performed at a sense amplifier 141 when the data is read from the memory array 140 and when the data is written to the memory array 140.

The memory array 140 includes a number of bit cells that are arranged in an array pattern. The bit cells are arranged at intersections of wordlines and bitlines, respectively. The bit cell which is arranged at the intersection of the wordline corresponding to the row address and the bitline corresponding to the column address is designated.

Herein, as illustrated in FIG. 2, the memory 100 includes only a single memory array 140, however the memory 100 may include two or more memory arrays 140. In a case where the memory 100 includes plural of the memory arrays 140, each of the memory arrays 140 may be referred to as a bank, and bank addresses may be assigned to the memory arrays 140, respectively.

Further, a bank address signal which indicates the bank address may be included in the address signal that is input to the address register 120, and a bank data which is obtained by decoding the bank address signal at a bank decoder may be input to the I/O port 133, in order to select the banks.

In this case, bit number of the data (DQ) and the data strobe signal (DQS) are increased by an amount equal to the bit number of the bank data. For example, in a case where number of the banks are eight, number of the buses 160~164, the data I/O terminal 180A and the data strobe signal I/O terminal 180B are increased up to eight, respectively.

The DLL 151 is connected to the read driver 150. The DLL 151 outputs a clock signal having a designated frequency to the read driver 150 in accordance with the differential clock signals (CK/CK#) that are input from the chipset 3 (see FIG. 1).

The read driver 150 performs wave shaping and amplification of the data (DQ) and the data strobe signal (DQS) that are read from the memory array 140, and outputs the data (DQ) and the data strobe signal (DQS) in accordance with the clock signal input from the DLL 151.

The write driver 152 performs wave shaping and amplification of the data (DQ) which is input from the data I/O terminal 180A via the buses 161 and 165, and the data strobe signal (DQS) which is input from the data strobe signal I/O terminal 180B via the bus 164, and outputs them to the I/O port 133.

The bus 160 connects the I/O port 133 and the read driver 150. The bus 161 connects the read driver 150 and the data I/O terminal 180A. The bus 162 connects the read driver 150 and the bus 164. The switch 170A is inserted into the bus 161 between the read driver 150 and the data I/O terminal 180A.

The bus 163 connects the I/O port 133 and the write driver 152. The bus 164 connects the write driver 152 and the data strobe signal I/O terminal 180B. The bus 165 connects the bus 161 and the write driver 152. The switch 170B is inserted into the bus 164 between the write driver 152 and the data strobe signal I/O terminal 180B.

The switch 170A is inserted into the bus 161 between the read driver 150 and the data I/O terminal 180A, and is switched on and off by the ODT controller 102. The switch 170A is switched off (opened) during the test of the memory 100, and is switched on (closed) during the normal operation.

The switch 170B is inserted into the bus 164 between the write driver 152 and the data strobe signal I/O terminal 180B, and is switched on and off by the ODT controller 102. The switch 170B is switched off (opened) during the test of the memory 100, and is switched on (closed) during the normal operation.

The data I/O terminal 180A is a type of a terminal via which the data that is to be written to the memory array 140 is input to the memory 100, and via which the data that is read from the memory array 140 is output from the memory 100. The data I/O terminal 180A is connected to the chipset 3 (see FIG. 1).

The data strobe signal I/O terminal 180B is a type of a terminal via which the data strobe signal (DQS) that is used when the data is written to the memory array 140 is input to the memory 100, and via which the data strobe signal (DQS) that is output from the memory array 140 when the data (DQ) is read from the memory array 140 is output from the memory 100. The data strobe signal I/O terminal 180B is connected to the chipset 3 (see FIG. 1).

The ODT circuits 190A and 190B are connected to the buses 161 and 164, respectively. The ODT circuit 190A includes the switches $191_1 \sim 191_n$ and resistors $192_1 \sim 192_n$. The ODT circuit 190B includes the switches $191_1 \sim 191_m$ and resistors $192_1 \sim 192_m$.

The switches $191_1 \sim 191_n$ of the ODT circuit 190A and the switches $191_1 \sim 191_m$ of the ODT circuit 190B are switched on and off by the ODT controller 102, respectively.

The switches $191_1 \sim 191_n$ and $191_1 \sim 191_m$ may be realized by transistors that are switched on and off by the ODT controller 102, respectively, for example.

The resistors $192_1 \sim 192_n$ of the ODT circuit 190A and the resistors $192_1 \sim 192_m$ of the ODT circuit 190B are terminated by being connected to a power source which outputs power-source voltage (VDDQ/2), respectively.

A power source which outputs power-source voltage VDD is connected to the controller 110, the address register 120, the row decoder 130, the refresh counter 131, the column decoder 132, the I/O port 133 and the memory array 140.

A power source which outputs power-source voltage VDDQ is connected to the read driver 150 and the write driver 152.

A power source line of the power source which outputs the power-source voltage VDD and a power source line of the power source which outputs the power-source voltage VDDQ are different from each other. The power source which is connected to the read driver 150 and the write driver 152 and the power source which is connected to the resistors $192_1 \sim 192_n$ and $192_1 \sim 192_m$ are connected to the same power source line.

Herein, the suffix n indicates number of the switches $191_1 \sim 191_n$ and the resistors $192_1 \sim 192_n$ of the ODT circuit 190A. The suffix n is greater than or equal to 2. The suffix m indicates number of the switches $191_1 \sim 191_m$ and the resistors $192_1 \sim 192_m$ of the ODT circuit 190B. The suffix m is greater than or equal to 2. The suffix n may be equal to the suffix m, or may be different from the suffix m.

In a case where the memory 100 includes plural of the memory arrays 140, plural of the ODT circuits 190A may be connected to the buses 161 corresponding to the memory arrays 140, respectively. Similarly, in this case, plural of the ODT circuits 190B may be connected to the buses 164 corresponding to the memory arrays 140, respectively. The switches $191_1 \sim 191_n$ of the ODT circuits 190A and the resistors $191_1 \sim 191_m$ of the ODT circuits 190B may be switched on and off by the ODT controller 102.

For example, in a case where the number of the banks of the memory arrays 140 is eight, eight ODT circuits 190A may be connected to eight buses 161, respectively. Similarly, in this case, eight ODT circuits 190B may be connected to eight buses 164, respectively. All of the switches $191_1 \sim 191_n$ and $191_1 \sim 191_m$ may be switched on and off by the ODT circuit 102.

Next, the heat test and the noise margin test of the memory 100 according to the first embodiment is described.

Herein, for example, an embodiment in which the number of the banks is one, the suffix n is three and the suffix m is two is described. Accordingly, the ODT circuit 190A includes the switches $191_1$, $191_2$ and $191_3$ and the resistors $192_1$, $192_2$ and $192_3$, and the ODT circuit 190B includes the switches $191_1$ and $191_2$ and the resistors $192_1$ and $192_2$, respectively.

Further, for example, resistances of the resistors $192_1$ and $192_2$ of the ODT circuits 190A and 190B are 50Ω and 75Ω, respectively. Resistance of the resistor $192_3$ of the ODT circuit 190A is 10Ω.

In this case, the ODT circuits 190A and 190B may use any one of the resistors $192_1$ (50Ω) and $192_2$ (75Ω), in order to adjust terminating resistances of the buses 161 and 164 during the normal operation of the memory 100, respectively. Any one of the switches $191_1$ and $191_2$ may be switched on by the ODT controller 102 in accordance with characteristic impedances of the buses 161 and 164. The ODT circuit 102 may be set to switch on any one of the switches $191_1$ and $191_2$ in accordance with the characteristic impedances of the buses 161 and 164 in advance, for example.

Since the resistance of the resistor $192_3$ of the ODT circuit 190A is smaller than the resistances of the resistors $192_1$ and $192_2$ that are used for adjusting the terminating resistances of the buses 161 and 164, more current flows through the resistor $192_3$ than through the resistors $192_1$ and $192_2$.

Thus, it becomes possible to heat the memory array 140 effectively by supplying pulse current to the resistor $192_3$ which has lower resistance than the resistors $192_1$ and $192_2$ from the oscillator 103.

According to the first embodiment, the heat test of the memory 100 is conducted by supplying the pulse current to the resistor $192_3$ of the ODT circuit 190A and thereby heating the memory array 140.

Test data is written to the memory array 140 before the test of the memory 100 is conducted. In this condition, the memory array 140 is separated from the buses 161 and 164 by switching off the switches 170A and 170B. Then the memory array 140 is heated by the resistor $192_3$ of the ODT circuit 190A. Thus, it becomes possible to conduct the heat test of the memory 100 by comparing the test data before and after the heat test.

Although, as described above, the resistance of the resistor $192_3$ is 10Ω, the resistance of the resistor 1923 is not limited to 10Ω. The resistance of the resistor $192_3$ may be set in accordance with temperature of the memory array 140 at which the heat test is conducted.

Although, as described above, the ODT circuit 190A includes the resistor $192_3$ which has smaller resistance than the resistors $192_1$ and $192_2$ that are used for adjusting the terminating resistance, the resistors $192_1$ and $192_2$ may be used for the heat test by connecting the resistors $192_1$ and $192_2$ in parallel in order to obtain smaller resistance that can be used for the heat test. In this case, the ODT circuit 190A may not include the resistor $192_3$. In order to connect the resistors $192_1$ and $192_2$ in parallel, the switches $191_1$ and $191_2$ may be switched on.

According to the first embodiment, it becomes possible to conduct the noise margin test of the memory 100 as follows. Test data is written to the memory array 140 before the noise margin test is conducted, and then the memory array 140 is separated from the buses 161 and 164 by switching off the switches 170A and 170B. In this condition, the clock signal is supplied to the ODT circuit 190A from the oscillator 103, and then the test data is read from the memory array 140. Thus, it becomes possible to conduct the noise margin test of the memory 100 by comparing the test data before and after the noise margin test.

During the noise margin test, any one of the switches $191_1$~$191_3$ of the ODT circuit 190A may be switched on in order to supply the clock signal to the corresponding resistor among the resistors $192_1$~$192_3$.

For example, in a case where the operating frequency of the memory 100 is 100 MHz, the frequency of the differential clock signals (CK/CK#) that are input to the controller 110 is 100 MHz. In this case, the memory 100 causes the oscillator 103 to oscillate a clock signal at 200 MHz or 300 MHz and to input the clock signal to the ODT circuit 190A as a noise signal.

The resistors $192_1$~$192_3$ of the ODT circuit 190A are connected to the power source having the power-source voltage (VDDQ/2). The power source is also connected to the read driver 150 and the write driver 152.

The clock signal of the oscillator 103 is input to the ODT circuit 190A as the noise signal in a condition in which the memory array 140 is separated from the buses 161 and 164 by switching off the switches 170A and 170B. In this condition, it becomes possible to determine whether the data stored in the memory array 140 is affected by the noise signal through the power source of the read driver 150 and the write driver 152.

The power source which is connected to the controller 110, the address register 120, the row decoder 130, the refresh counter 131, the column decoder 132, the I/O port 133, and the memory array 140 is different from the power source which is connected to the read driver 150 and the write driver 152.

However, both power sources are connected to the same original power source. Thus, it becomes possible to determine whether the data stored in the memory array 140 is affected by the noise signal through the power source of the controller 110, the address register 120, the row decoder 130, the refresh counter 131, the column decoder 132, the I/O port 133, and the memory array 140.

According to the memory 100 of the first embodiment, it becomes possible to conduct the noise margin test by supplying the clock signal, having the different frequency from the operating frequency of the memory array 140, to the ODT circuit 190A from the oscillator 103 in the condition in which the switches 170A and 170B are switched off.

The memory 100 may be connected to devices such as the CPU 2 or the chipset 3, for example, that have the different operating frequency from the operating frequency of the memory 100 after being assembled into the PC 1 as illustrated in FIG. 1. In such a case, noise may be input to the memory 100 from the devices having the operating frequency different from the operating frequency of the memory 100. Thus, it is preferable to check the operation of the memory 100 by conducting the noise margin test which utilizes the clock signal having the operating frequency different from the operating frequency of the memory 100.

Accordingly, in the noise margin test, the oscillator 103 oscillates the clock signal having the operating frequency different from the operating frequency of the memory 100 when the test mode signal is input to the oscillator 103 from the mode register 111. In this case, the oscillator 103 may oscillate clock signals having different frequencies in accordance with the test mode signal. The oscillator 103 may vary the frequency of the clock signals during the noise margin test.

Herein, it is possible to conduct the test which combines the heat test and the noise margin test by selecting the resistor $192_3$ of the ODT circuit 190A.

In conclusion, in order to conduct the heat test and the noise margin test, according to the memory 100 of the first embodiment, the switches 104, 170A and 170B, the switches $191_1$~$191_3$ of the ODT circuit 190A, and the switches $191_1$ and $191_2$ of the ODT circuit 190B are switched on or off as illustrated in FIG. 3.

The switches are switched on or off by the ODT controller 102 in accordance with the mode select signal that is output from the mode controller 101.

FIG. 3 is a diagram illustrating on and off states of the switches 104, 170A and 170B, the switches $191_1$~$191_3$ of the ODT circuit 190A, and the switches $191_1$ and $191_2$ of the ODT circuit 190B in the normal mode, the noise margin test mode and the heat test mode.

As illustrated in FIG. 3, in the normal mode, the switch 104 is switched off, the switches 170A and 170B are switched on, the switch $191_1$ or $191_2$ of the ODT circuit 190A is switched on, and the switch $191_1$ or $191_2$ of the ODT circuit 190B is switched on.

Accordingly, the oscillator 103 is separated from the bus 161, and the data I/O terminal 180A and the data strobe signal I/O terminal 180B are connected to the memory array 140.

Thus, the memory 100 can read the data from the memory array 140 and write the data to the memory array 140.

As illustrated in FIG. 3, in the noise margin test mode, the switch 104 is switched on, the switches 170A and 170B are switched off, the switch $191_1$, $191_2$ or $191_3$ of the ODT circuit 190A is switched on, and the switch $191_1$ or $191_2$ of the ODT circuit 190B is switched on.

Accordingly, the oscillator 103 is connected to the ODT circuit 190A via the bus 161, and the memory array 140 is separated from the ODT circuit 190A and the buses 161 and 164.

Thus, it becomes possible to conduct the noise margin test of the memory 100 by supplying the clock signal to the resistor $192_1$, $192_2$ or $192_3$ of the ODT circuit 190A from the oscillator 103, in a condition where the memory array 140 is separated from the ODT circuit 190A and the buses 161 and 164.

As illustrated in FIG. 3, in the heat test mode, the switch 104 is switched on, the switches 170A and 170B are switched off, the switch $191_3$ of the ODT circuit 190A is switched on, and the switch $191_1$ or $191_2$ of the ODT circuit 190B is switched on.

Accordingly, the oscillator 103 is connected to the ODT circuit 190A via the bus 161, and the memory array 140 is separated from the ODT circuit 190A and the buses 161 and 164.

Thus, it becomes possible to conduct the heat test of the memory 100 by supplying the clock signal to the resistor $192_3$ of the ODT circuit 190A from the oscillator 103, in a condition where the memory array 140 is separated from the ODT circuit 190A and the buses 161 and 164.

Temperature of the memory 100 in the heat test may be set in accordance with resistance of the resistor $192_3$ of the ODT circuit 190A and power of the clock signal supplied from the oscillator 103 or the like. In this case, the heat test may be conducted at different temperatures by using plural of the resistors $192_3$ in the ODT circuit 190A.

Next, the steps of the test of the memory 100 according to the first embodiment are described with reference to FIG. 4.

Figure 4:
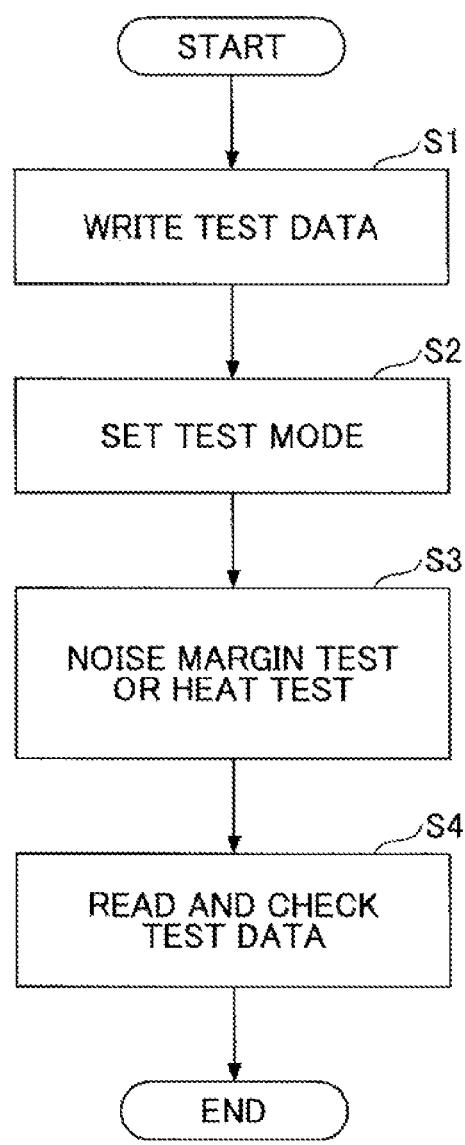
FIG. 4 is a diagram illustrating steps of the test of the memory of the first embodiment.

FIG. 4 is a diagram illustrating steps of the test of the memory 100 of the first embodiment.

In order to conduct the noise margin test or the heat test of the memory 100, the test data is written to the memory array 140 (step S1).

The process of step S1 is executed by the CPU 2 (see FIG. 1). In step S1, the CPU 2 accesses the memory 100 via the chipset 3 and writes the test data to the memory array 140. Herein, the test data may be stored in the hard disk 9 (see FIG. 1) in advance, for example.

Next, in order to set the memory 100 on the test mode, the ODT controller 102 switches on and off the switches as illustrated in FIG. 3 in accordance with the mode select signal which is input from the mode controller 101 (step S2).

More specifically, in the noise margin test mode, the switch 104 is switched on, the switches 170A and 170B are switched off, the switch $191_1$, $191_2$ or $191_3$ of the ODT circuit 190A is switched on, and the switch $191_1$ or $191_2$ of the ODT circuit 190B is switched on.

In the heat test, the switch 104 is switched on, the switches 170A and 170B are switched off, the switch $191_3$ of the ODT circuit 190A is switched on, and the switch $191_1$ or $191_2$ of the ODT circuit 190B is switched on.

Since the ODT circuit 190B is not used in the heat test of the memory 100, it makes no difference whether the switches $191_1$ and $191_2$ of the ODT circuit 190B are switched on or off.

Next, the noise margin test or the heat test is conducted (step S3).

In the noise margin test or the heat test, the oscillator 103 oscillates the clock signal of which the frequency is determined by the test mode signal when the test mode signal is input from the mode register 111 of the controller 110.

In the noise margin test mode, the oscillator 103 oscillates the clock signal of which the frequency is different from the operating frequency of the memory 100 in accordance with the test mode signal input from the mode register 111 and supplies the clock signal to the switch $191_1$, $191_2$ or $191_3$ of the ODT circuit 190A that is switched on in step S2.

In the heat test mode, the oscillator 103 oscillates the clock signal that is used for the heat test in accordance with the test mode signal input from the mode register 111 and supplies the clock signal to the resistor $192_3$ of the ODT circuit 190A that is switched on in step S2.

Finally, the test data which is read from the memory array 140 through the CPU 2 is checked against the test data which is written to the memory 140 before the test (step S4).

In a case where the test data (original test data) which is written to the memory array 140 before the test matches precisely the test data which is read from the memory array 140 after the test, the test of the memory 100 of the first embodiment is completed.

In a case where the test data read from the memory array 140 after the test does not match the original test data, the memory 100 may be exchanged.

As described above, according to the memory 100 of the first embodiment, it becomes possible to conduct the noise margin test and the heat test of the memory 100 by using the ODT circuit 190A included in the memory 100.

According to the memory 100 of the first embodiment, it becomes possible to conduct the noise margin test by supplying the clock signal, having the different frequency from the operating frequency of the memory 100, to the ODT circuit 190A from the oscillator 103 in the condition in that the switches 170A and 170B are switched off.

As for the conventional semiconductor memory device, it is difficult to supply a clock signal of which the frequency is different from the operating frequency in a condition where the semiconductor memory device is mounted on the circuit board. On the contrary, according to the memory 100 of the first embodiment, it is possible to easily conduct the noise margin test in a condition where the memory 100 is mounted on the circuit board of the PC 1.

It is possible to supply clock signals having various frequencies to the ODT circuit 190A by setting the frequency of the clock signal oscillated from the oscillator 103. Thus, it is possible to conduct the noise margin test at the various frequencies.

Although, as described above, the test is conducted in a condition where the memory 100 according to the first embodiment is mounted in the PC 1, the noise margin test and the heat test may be conducted in a condition where the memory 100 is connected to an LSI tester which can read the data from and write the data to the memory 100.

In this case, it is possible to conduct the test in a condition before the memory 100 is mounted into the PC 1. Therefore, it is possible to easily conduct the noise margin test or the heat test of the memory 100 by utilizing the ODT circuit 190A at the factory, for example.

According to the conventional semiconductor memory device, it is necessary to change the power source or to vary power-source voltage in order to conduct the noise margin test. On the contrary, according to the first embodiment, as described above, it is easy to conduct the noise margin test of the memory 100.

Although, according to the conventional semiconductor memory device, it is necessary to put the semiconductor memory device into the high-temperature storage in order to conduct the heat test, it is possible to conduct the heat test without using the high-temperature storage, according to the memory 100 of the first embodiment.

As described above, according to the memory 100 of the first embodiment, it is easy to conduct the noise margin test and the heat test.

Although, as described above, both of the switches 170A and 170B are switched off when the oscillator 103 supplies the clock signal to the ODT circuit 190A during the test, the switch 170B which is not connected to the ODT circuit 190A may be switched on during the test.

Although, as described above, the oscillator 103 supplies the clock signal to the ODT circuit 190A during the test, the oscillator 103 may supply the clock signal to the ODT circuits 190A and 190B. The oscillator 103 may supply the clock signal to the ODT circuit 190B instead of the ODT circuit 190A in order to conduct the test.

Second Embodiment

Figure 5:
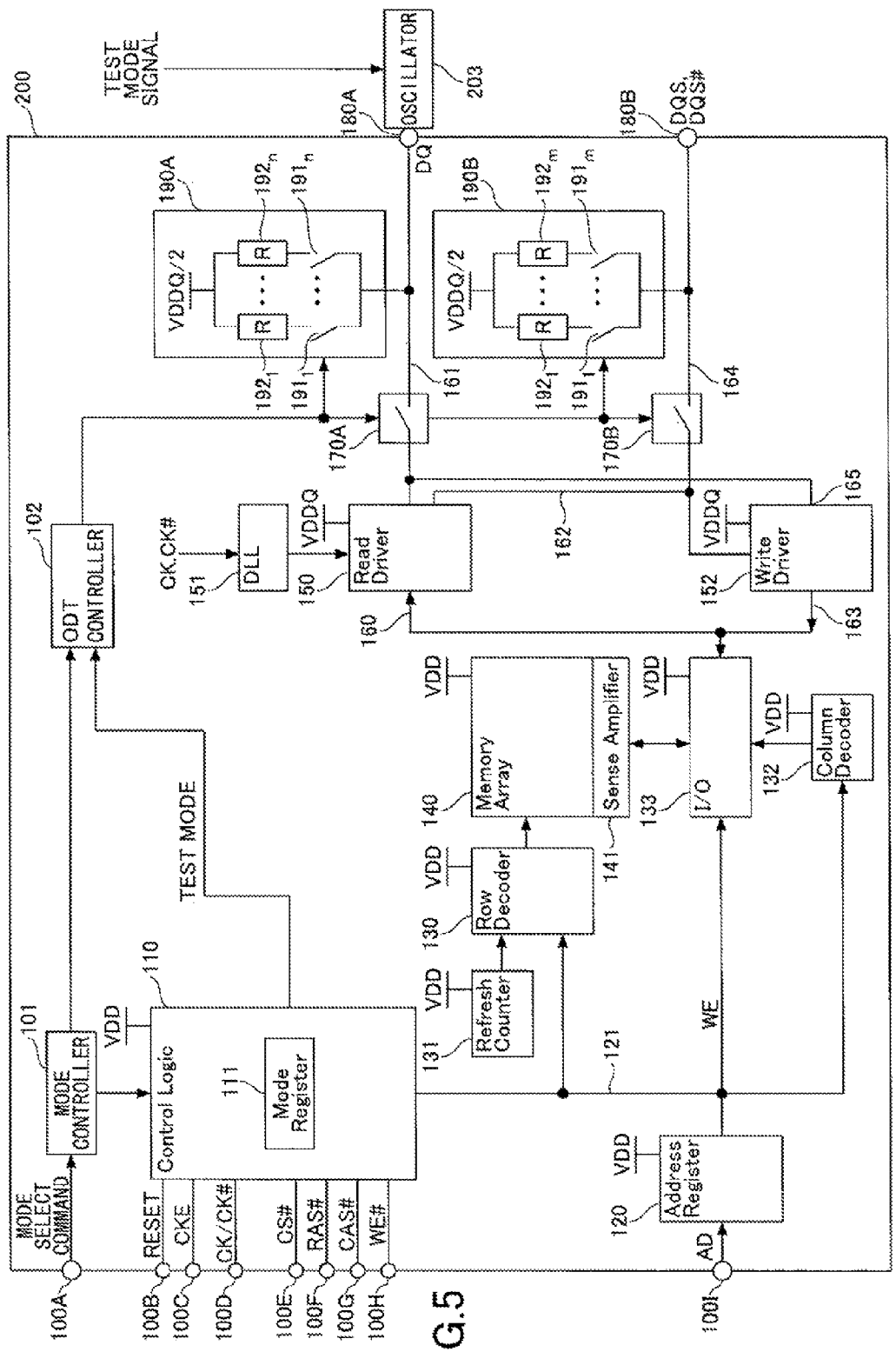
FIG. 5 is a block diagram illustrating a memory of a second embodiment.

FIG. 5 is a block diagram illustrating a memory 200 of the second embodiment.

The memory 200 is one example of the semiconductor memory device according to the first embodiment. Herein, the embodiment in which the memory 200 is constituted of DRAM is described, for example.

The memory 200 includes a mode controller 101, an ODT controller 102, a controller 110, a mode register 111, an address register 120 and a bus 121.

The memory 200 further includes a row decoder 130, a refresh counter 131, a column decoder 132, an I/O port 133, a memory array 140, a read driver 150, a DLL 151 and a write driver 152.

The memory 200 further includes buses 160, 161, 162, 163, 164 and 165, switches 170A and 170B, a data I/O terminal 180A, a data strobe signal I/O terminal 180B and ODT circuits 190A and 190B.

The differences between the memory 200 of the second embodiment and the memory 100 of the first embodiment are mainly as follows.

The memory 200 does not include the oscillator 103 which is included in the memory 100. During the test, a connector of the chipset 3 (see FIG. 1) is detached from the data I/O terminal 180A, and an oscillator 203 which is located outside of the memory 200 is connected to the data I/O terminal 180A. A random signal generator may be used as the oscillator 203, for example.

The test mode signal is input directly to the oscillator 203 from the PC 1. The oscillator 203 is controlled by the PC 1 and oscillates the clock signal for the noise margin test and the clock signal for the heat test.

Herein, the clock signals that are used for the noise margin test and the heat test are similar to the clock signals that are used for the noise margin test and the heat test of the first embodiment, respectively.

When the data is read from the memory array 140 after the test, the oscillator 203 is detached from the data I/O terminal 180A, and the connector of the chipset 3 is connected to the data I/O terminal 180A, in order to read the data through the CPU 2.

Otherwise, the memory 200 according to the second embodiment is the same as the memory 100 of the first embodiment. Accordingly, the same elements as or elements similar to those of the memory 100 of the first embodiment are referred to by the same reference numerals, and a description thereof is omitted.

Figure 6:
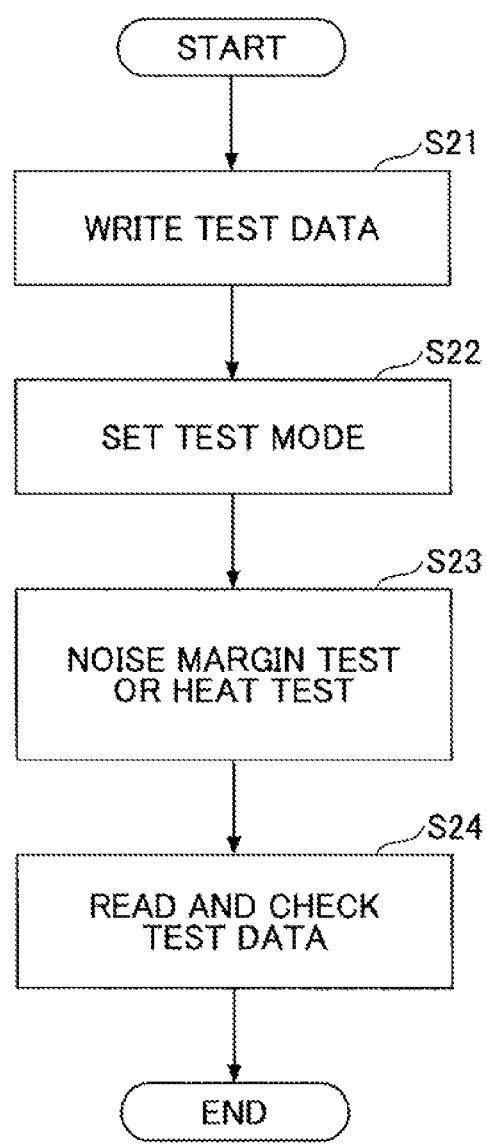
FIG. 6 is a block diagram illustrating steps of the test of the memory of the second embodiment.

FIG. 6 is a diagram illustrating steps of the test of the memory 200 of the second embodiment.

In order to conduct the noise margin test or the heat test of the memory 200, the test data is written to the memory array 140 (step S21). The process in step S21 is similar to the process in step S1 according to the first embodiment.

Next, the connector of the chipset 3 (see FIG. 1) is detached from the data I/O terminal 180A, and the oscillator 203 which is located outside of the memory 200 is connected to the data I/O terminal 180A.

Next, in order to set the memory 200 in the test mode, the ODT controller 102 switches on and off the switches as illustrated in FIG. 3 in accordance with the mode select signal which is input from the mode controller 101 (step S22). The process in step S22 is similar to the process in step S2 according to the first embodiment.

Next, the noise margin test or the heat test is conducted (step S23).

In the noise margin test or the heat test, the oscillator 203 oscillates the clock signal of which the frequency is determined by the test mode signal when the test mode signal is input from the PC 1.

In the noise margin test, the oscillator 203 oscillates the clock signal of which the frequency is different from the operating frequency of the memory 200 in accordance with the test mode signal input from the PC 1 and supplies the clock signal to the switch $191_1$, $191_2$ or $191_3$ that is switched on in step S22.

In the heat test mode, the oscillator 203 oscillates the clock signal that is used for the heat test in accordance with the test mode signal input from the PC 1 and supplies the clock signal to the resistor $192_3$ of the ODT circuit 190A that is switched on in step S22.

Next, the oscillator 203 is detached from the data I/O terminal 180A, and the connectors of the chipset 3 (see FIG. 1) are connected to the data I/O terminal 180A and the data strobe signal I/O terminal 180B.

Finally, the test data which is read from the memory array 140 is checked against the test data which is written to the memory 140 before the heat test (step S24).

Thus, the test of the memory 200 according to the second embodiment is completed.

As described above, according to the memory 200 of the second embodiment, it becomes possible to conduct the noise margin test and the heat test of the memory 200 by using the ODT circuit 190A included in the memory 200.

According to the conventional semiconductor memory device, it is difficult to conduct the noise margin test in a condition where the semiconductor memory device is not mounted into the PC 1. On the contrary, according to the memory 200 of the second embodiment, it is possible to conduct the noise margin test in a condition where the memory 200 is not mounted into the PC1.

It is possible to supply clock signals having various frequencies to the ODT circuit 190A by setting the frequency of the clock signal oscillated from the oscillator 203. Thus, it is possible to conduct the noise margin test at the various frequencies.

Although, according to the conventional semiconductor memory device, it is necessary to put the semiconductor memory device into the high-temperature storage in order to conduct the heat test, it is possible to conduct the heat test without using the high-temperature storage, according to the memory 200 of the second embodiment.

As described above, according to the memory 200 of the second embodiment, it is easy to conduct the noise margin test and the heat test.

According to the memory 200 of the second embodiment, it becomes possible to conduct the noise margin test by supplying the clock signal, having the different frequency from the operating frequency of the memory 200, to the ODT circuit 190A from the oscillator 203 in the condition in that the switches 170A and 170B are switched off.

As for the conventional semiconductor memory device, it is difficult to supply clock signal of which the frequency is different from the operating frequency in a condition where the semiconductor memory device is mounted on the circuit board. On the contrary, according to the memory 200 of the second embodiment, it is possible to easily conduct the noise margin test in a condition where the memory 200 is mounted on the circuit board of the PC 1.

It is possible to supply clock signals having various frequencies to the ODT circuit 190A by setting the frequency of the clock signal oscillated from the oscillator 203. Thus, it is possible to conduct the noise margin test at the various frequencies.

Although, as described above, the test is conducted in a condition where the memory 200 according to the second embodiment is mounted in the PC 1, the noise margin test and the heat test may be conducted in a condition where the memory 200 is connected to the LSI tester which can read the data from and write the data to the memory 200.

In this case, it is possible to conduct the test in a condition before the memory 200 is mounted into the PC 1. Therefore, it is possible to easily conduct the noise margin test or the heat test of the memory 200 by utilizing the ODT circuit 190A at the factory, for example.

According to the conventional semiconductor memory device, it is necessary to change the power source or to vary power-source voltage in order to conduct the noise margin test. On the contrary, according to the second embodiment, as described above, it is easy to conduct the noise margin test of the memory 200.

Although, according to the conventional semiconductor memory device, it is necessary to put the semiconductor memory device into the high-temperature storage in order to conduct the heat test, it is possible to conduct the heat test without using the high-temperature storage, according to the memory 200 of the second embodiment.

As described above, according to the memory 200 of the second embodiment, it is easy to conduct the noise margin test and the heat test.

Since the memory 200 does not include the oscillator 203, it becomes possible to simplify the configuration of the memory 200 compared with the memory 100 of the first embodiment.

Although, as described above, the PC 1 is connected to the oscillator 203, and the test mode signal is input to the PC 1 from the oscillator 203, a device which inputs the test mode signal to the oscillator 203 is not limited to the PC 1 as long as the device can control the frequency of the clock signal of the oscillator 203. A PC or a server other than the PC 1 may be used for inputting the test mode signal to the oscillator 203. In a case where the oscillator 203 includes a function of controlling the frequency of the clock signal, it is not necessary to connect the PC 1 to the oscillator 203.

Although, as described above, the memories 100 and 200 of the first and second embodiments are DRAM, the memories 100 and 200 may be Static Access Memories (SRAM), flush memories or the like.

So far, the preferred embodiments and modification of the semiconductor memory devices are described. However, the invention is not limited to those specifically described embodiments and the modification thereof, and various modifications and alteration may be made within the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention.

Although the embodiments of the present invention have been described in detail, it should be understood that the various changes, substitutions, and alterations could be made hereto without departing from the spirit and scope of the invention.

What is claimed is:

1. A semiconductor memory device comprising:
    an On Die Termination (ODT) circuit configured to be connected to a bus which transmits a data signal or a data strobe signal between a memory block and an input-output terminal;
    a first switch configured to be inserted into the bus between the memory block and the ODT circuit;
    a mode controller configured to switch off the first switch during a test of the memory block; and
    an oscillator configured to be connected to the ODT circuit, wherein a test signal is supplied to the ODT circuit from the oscillator during the test of the memory block.

2. A semiconductor memory device comprising:
    an On Die Termination (ODT) circuit configured to be connected to a bus which transmits a data signal or a data strobe signal between a memory block and an input-output terminal;
    a switch configured to be inserted into the bus between the memory block and the ODT circuit; and
    a mode controller configured to switch off the switch during a test of the memory block;
    wherein a test signal is supplied to the ODT circuit from an oscillator which is connected to the input-output terminal during the test of the memory block.

3. The semiconductor memory device as claimed in claim 1 further comprising:
    a second switch configured to be inserted between the ODT circuit and the oscillator,
    wherein the mode controller switches off the second switch during a normal operation of the memory block and switches on the second switch during the test of the memory block.

4. The semiconductor memory device as claimed in claim 1, wherein the mode controller sets resistance of the ODT circuit to a test resistance by switching a switch included in the ODT circuit during the test of the memory block.

5. The semiconductor memory device as claimed in claim 4, wherein the test of the memory block is a heat test, and wherein the test resistance is lower than a resistance of the ODT circuit during the normal operation of the memory block.

6. The semiconductor memory device as claimed in claim 4, wherein the ODT circuit includes a test resistor which is used during the test of the memory block and has lower resistance than that of a resistor which is used during the normal operation of the memory block, and wherein the mode controller sets resistance of the ODT circuit to the test resistance by selecting the test resistor during the test of the memory block.

7. The semiconductor memory device as claimed in claim 1, wherein the test of the memory block is a noise margin test, and wherein the oscillator oscillates a signal having a frequency different from an operation frequency of the memory block during the noise margin test of the memory block.

8. The semiconductor memory device as claimed in claim 2, wherein the mode controller sets resistance of the ODT circuit to a test resistance by switching a switch included in the ODT circuit during the test of the memory block.

9. The semiconductor memory device as claimed in claim 8, wherein the test of the memory block is a heat test, and wherein the test resistance is lower than a resistance of the ODT circuit during the normal operation of the memory block.

10. The semiconductor memory device as claimed in claim 8, wherein the ODT circuit includes a test resistor which is used during the test of the memory block and has lower resistance than that of a resistor which is used during the normal operation of the memory block, and wherein the mode controller sets resistance of the ODT circuit to the test resistance by selecting the test resistor during the test of the memory block.

11. The semiconductor memory device as claimed in claim 2, wherein the test of the memory block is a noise margin test, and wherein the oscillator oscillates a signal having a frequency different from an operation frequency of the memory block during the noise margin test of the memory block.

12. An information processing apparatus comprising:
   the semiconductor memory device as claimed in claim 1; and
   a processing unit configured to be connected to the semiconductor memory device, wherein the processing unit writes data to the semiconductor memory device and reads data from the semiconductor memory device.

* * * * *